United States Patent [19]

Marin et al.

[11] 4,367,473
[45] Jan. 4, 1983

[54] DISTANCE MEASURING EQUIPMENT UTILIZING FREQUENCY MODULATION

[75] Inventors: Guy F. M. Marin, Boulogne; Dominique J. Podvin, Bures sur Yvette; Jean-Pierre Susset, Buc, all of France

[73] Assignee: U.S. Philips Corporation, New York, N.Y.

[21] Appl. No.: 167,565

[22] Filed: Jul. 11, 1980

[30] Foreign Application Priority Data

Jul. 13, 1979 [FR] France .................. 79 18258

[51] Int. Cl.³ .................. G01S 13/26; G01S 13/34; G01S 7/40
[52] U.S. Cl. .................. 343/14; 343/7.5; 343/17.5; 343/17.7
[58] Field of Search .................. 343/7.5, 14, 17.5, 17.7

[56] References Cited

U.S. PATENT DOCUMENTS 4,151,525 4/1979 Strauch et al. .................. 343/7.5
4,238,795 12/1980 Schiek et al. .................. 343/14

Primary Examiner—S. C. Buczinski
Attorney, Agent, or Firm—Robert J. Kraus

[57] ABSTRACT

A radio distance measuring equipment emits a frequency modulated carrier wave signal, having a periodic frequency deviation $\Delta F$ and a mean frequency $F_o$, toward an object, and receives a portion of the carrier wave signal reflected by the object. A beat signal produced by mixing the emitted and received signals is applied to a control loop which determines the distance. Operation of the equipment is periodically interrupted, under the control of a microprocessor, to effect calibration of the frequency deviation and the mean frequency.

4 Claims, 7 Drawing Figures

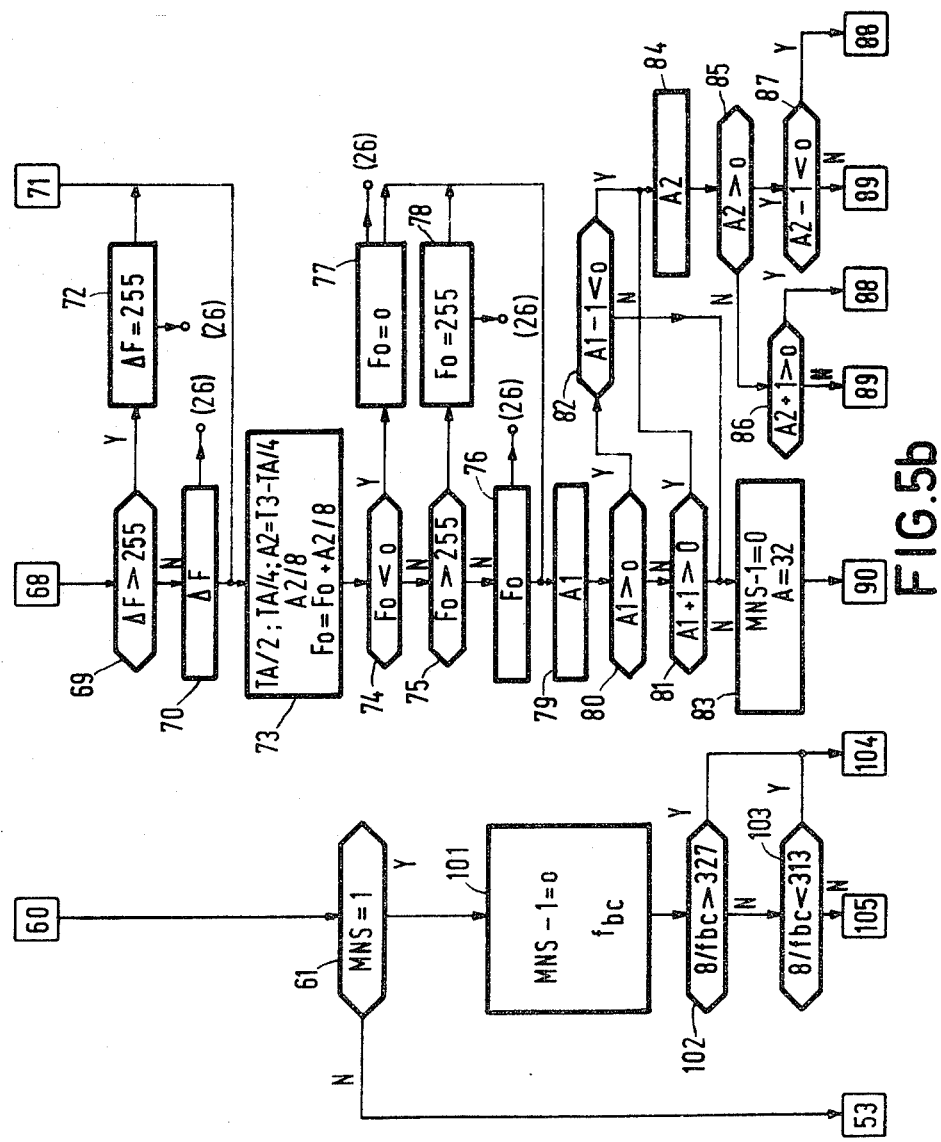

DISTANCE MEASURING EQUIPMENT UTILIZING FREQUENCY MODULATION

BACKGROUND OF THE INVENTION

The invention relates to radio distance measuring equipment, comprising means for linear frequency modulation, with a frequency deviation ΔF, of a carrier wave having a mean frequency Fo produced by a carrier wave source. The equipment also includes means for emitting the modulated carrier wave, means for mixing carrier wave energy reflected by an object with a part of the emitted wave in order to form a beat signal having a beat frequency fb, and control means for keeping the beat frequency fb constant by varying of the period of the frequency modulation.

In known radio distance measuring equipment as described in the technical journal "L'Onde Electronique," June 1979, pages 615–621, precision is realized by calibrating the frequency deviation ΔF at regular intervals by means of an internal standard delay line which periodically takes the place of the distance to be measured, and by controlling the beat frequency fb.

SUMMARY OF THE INVENTION

In a radio distance measuring equipment configured in accordance with the invention, a calibration phase is started at regular intervals for calibrating the frequency deviation ΔF and the mean frequency Fo. Calibration is effected with respect to tuning frequencies of two resonant cavities and which are coupled to the output of the carrier wave source. The precision of the control means is controlled by measuring the frequency fbc of a calibration beat signal originating from a calibration signal source which is coupled to the input for the beat signal.

BRIEF DESCRIPTION OF THE DRAWING

The distance measuring equipment according to the invention will be described hereinafter with reference to the accompanying diagrammatic drawing, in which:

FIGS. 5a, 5b and 5c show flow charts of the program of a microprocessor utilized for the calibration and for controlling the precision of the control means.

DESCRIPTION OF THE PREFERRED EMBODIMENTS

Figure 1:
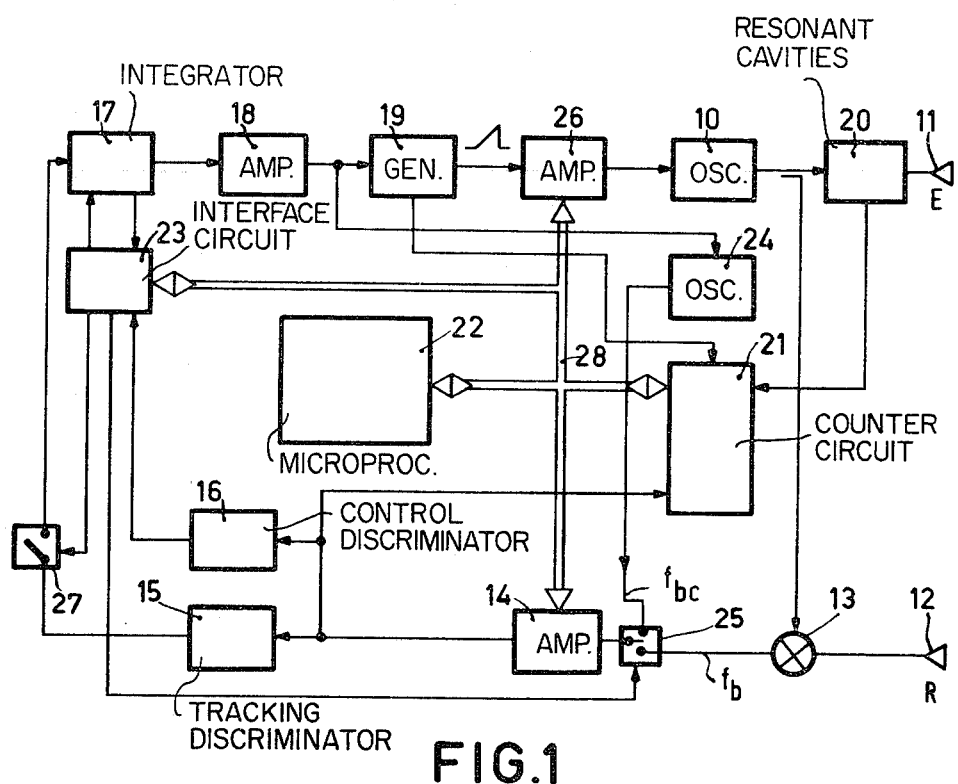
FIG. 1 shows a block diagram of a radioaltimeter.

A frequency modulation oscillator 10 (FIG. 1) generates a carrier wave having a mean frequency Fo which is linearly modulated with a sawtooth modulation signal from a generator 19, producing a frequency deviation ΔF. This modulated wave is emitted towards the ground by an emission aerial 11. After reflection by the ground, this wave is intercepted by a receiver signal aerial 12. A mixer 13 forms the product of the signal received and a part of the signal emitted. It supplies a beat signal of the frequency fb according to the expression:

$$fb = \tau \cdot \Delta F / T$$

where: $\tau$ is the delay of the wave between the emission and reception,

T is the modulation period, and

ΔF is the maximum frequency deviation.

The beat frequency fb is maintained constant by a control loop. Because the maximum frequency deviation ΔF is also constant, the modulation period T is varied as a function of the delay $\tau$.

The delay $\tau$ depends on the altitude of the aircraft. For the values ΔF = 123 MHz and fb = 25 kHz, T is varied by ten microseconds when the altitude is varied by one foot.

The control loop maintains the parameter fb constant. A tracking discriminator 15 supplies a positive or a negative error voltage, depending on whether the beat frequency fb is too high or too low. This error voltage is integrated (17), amplified (18) and applied to the generator 19 for sawtooth signals of constant amplitude and variable slope. The generator 19 ultimately controls the frequency of the signal of oscillator 10.

When the apparatus is switched on, the slope of the sawtooth may be incorrect and the beat frequency fb may deviate too much from its nominal value for the beat signal to be accepted by a beat signal amplifier 14 which has a narrow frequency band. The absence of a correct signal on the output of the amplifier 14 is detected by a control discriminator 16.

The circuits for calibrating the parameters ΔF and Fo and for controlling the precision of the control loop comprise two resonant cavities, operating at the frequencies F1 and F2, which are represented by the block 20. They are coupled to the output of the oscillator 10 as well as to a circuit 21.

The circuit 21 comprises three programmable counters. The first counter provides the timing of the output information by division of the clock frequency of the system. The second counter is used for measuring the modulation period T and the various time intervals necessary for the calibration. The third counter is used for measuring the calibration beat frequency fbc.

There are also provided a microprocessor 22 and an interface circuit 23 between the microprocessor 22 and the integrator 17. This circuit enables control of the integrator 17 by the control discriminator 16 under the control of the microprocessor 22.

A calibration oscillator 24 is provided for applying a calibration beat signal having the frequency fbc. The amplifier 14 is connected to the oscillator 24 through an electronic switch 25, controlled by the microprocessor 22 through the interface 23, during a calibration phase. A digitally controllable amplifier 26 adjusts the maximum magnitude of the signal provided by the generator 19 during the calibration phase, under the control of the microprocessor 22. The switch 27 interrupts the connection between the tracking discriminator 15 and the integrator 17 when the integrator is controlled by the control discriminator 16. An input/output bus 28 of the microprocessor comprises data lines, address lines and control lines. The bus 28 connects the microprocessor to all elements controlled thereby.

Figure 2:
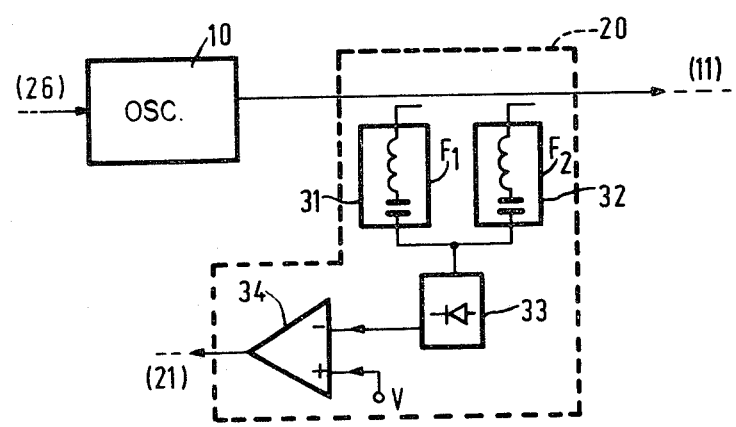
FIG. 2 illustrates the cavities used.

The block 20 (FIG. 2) comprises two microwave resonant cavities 31 and 32, equivalent to series oscillator circuits, which are coupled to the output of the carrier wave oscillator 10. The tuning frequencies F1 and F2 are 4260 MHz and 4342 MHz, respectively. The energy absorbed by the cavities when the frequency emitted passes their tuning frequencies is detected by an amplitude detector 33 and from these signals two pulses are derived by means of a circuit 34. These pulses, produced with respect to a threshold voltage V, are applied to the circuit 21.

Figure 3:
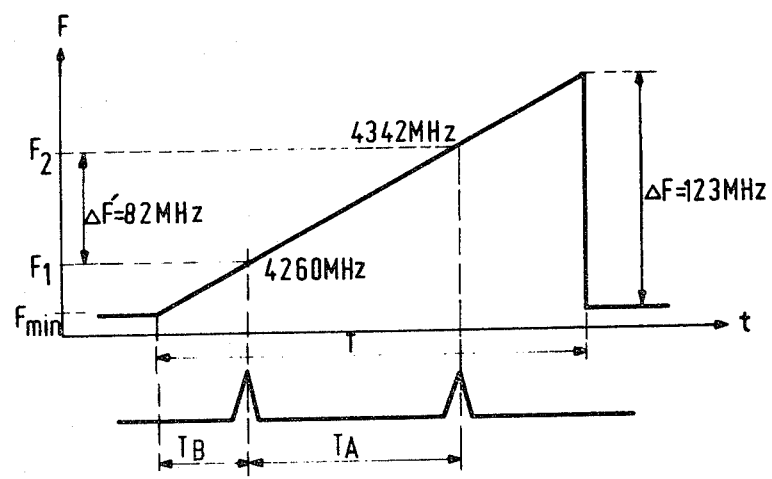
FIG. 3 illustrates the frequency modulation.

The basic idea of this system is to centre the maximum frequency deviation ΔF and the mean frequency Fo, emitted by the oscillator 10, with respect to the tuning frequencies of the cavities 31 and 32. This is shown in FIG. 3 which illustrates the modulation signal. The frequency deviation ΔF' between the tuning frequencies of the two cavities 31 and 32 is 82 MHz, the lowest frequency $F_{min}=4240$ MHz and the maximum frequency deviation ΔF=123 MHz.

For the calibration of the oscillator 10, the maximum frequency deviation ΔF emitted is controlled to the frequency deviation ΔF', and the mean frequency Fo to the tuning frequency F1 or F2 or (F1+F2)/2.

$$\Delta F = K \cdot \Delta F',$$

where K=123/82=3/2 for ΔF=123 MHz. For a given sawtooth signal having the period T, TA represents the time interval separating the pulses applied to circuit 21 by the block 20. For controlling the source 10 with respect to the maximum frequency deviation ΔF, the following conditions must be satisfied:

$$T = K \cdot TA$$

This is accomplished by modifying the amplitude of the modulation signal.

The tuning frequencies of the two cavities are centered around 4300 MHz. In order to maintain the mean frequency Fo at this value, the two intervals having the periods T and TA are centered with respect to each other.

If TB is the period of time separating the start of the sawtooth from the pulse which is caused by the first cavity 31, the following condition must be satisfied:

$$TB = (T - TA)/2$$

This is accomplished by shifting the level of the modulation signal.

In order to measure the period TA, it is necessary to take into account the width of the pulses produced by circuit 34, because this width affects the period of time required by the calibration sawtooth to ensure that the frequency deviation ΔF has the correct value. The precision of the period TB used for calibrating the mean frequency Fo is hardly affected by the width of the first pulse, because the mean frequency Fo has a value of several thousands of MHz and an error of 2 or 3 MHz is not significant.

Figure 4:
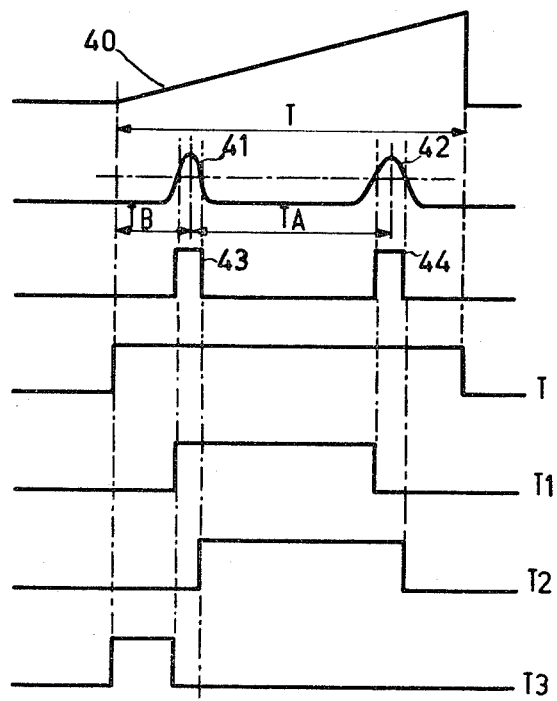
FIG. 4 illustrates the signals used for calibrating the frequency variables ΔF and Fo.

The sawtooth signal is represented by the reference 40 (FIG. 4) and the pulses produced by amplitude detector 33 are represented by the references 41 and 42. These pulses are shaped by the circuit 34 which produces the pulses 43 and 44. The period of the sawtooth is denoted by the time T; T1 is the period of time between the starts of the pulses 43 and 44; T2 is the period of time between the ends of the pulses 43 and 44; and T3 is the period of time between the starts of the sawtooth and the pulse 43. These periods T, T1, T2 and T3 take into account the widths of the pulses.

After the measurement of these periods, the microprocessor 22 performs the following intermediate calculations:

$$TA = (T1 + T2)/2 \text{ and } 3TA/2.$$

The latter term represents the period required by the calibration sawtooth in order to ensure that the frequency deviation ΔF is 123 MHz. The result is compared with T by forming the difference: A1=3Ta/2−T and next information depending on A1 is applied by processor 22 to the digitally controllable amplifier 26, which thereupon adjusts the amplitude of the sawtooth signal. The correct value of the frequency deviation ΔF will be obtained when ultimately A1=0.

The microprocessor subsequently determines TB=T3 and compares this result with (T1+T2)/8=(T−TA)/2 while forming the difference $$A2 = T3 - (T1 + T2)/8.$$

This term represents the correction to be applied to the oscillator 10 in order to ensure that the mean frequency Fo has the correct value.

The microprocessor sends information depending on A2 to the circuit 26 which thereupon shifts the level of the modulation signal. The correct mean frequency Fo of 4300 MHz is obtained when ultimately A2=0.

The circuit 26 has a given transfer function for obtaining the gradients of 1 MHz/unit of the control signal for Fo and 0.5 MHz/unit of the control signal for ΔF. In order to test the efficiency of the calibration it is sufficient to verify that the terms A1 and A2 are approximately zero at the end of each sequence. They are normally situated between +1 and −1.

Under these circumstances the stability of the calibration is: ±0.5 MHz for ΔF and ±1 MHz for Fo. The precision is only dependent on the precision of the tuning of the cavities; it may be better than ±0.5 MHz.

Figure 5A:
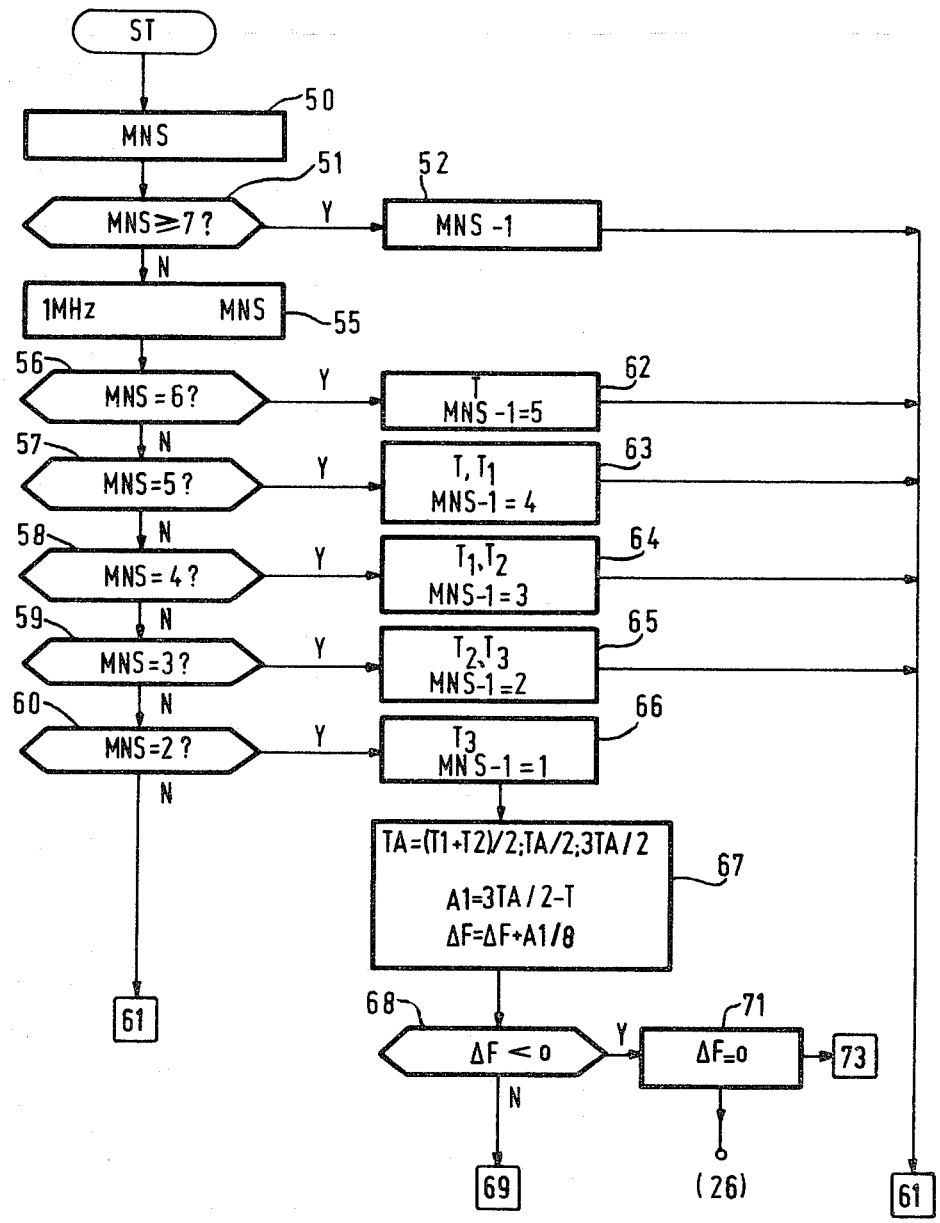
Figure 5C:
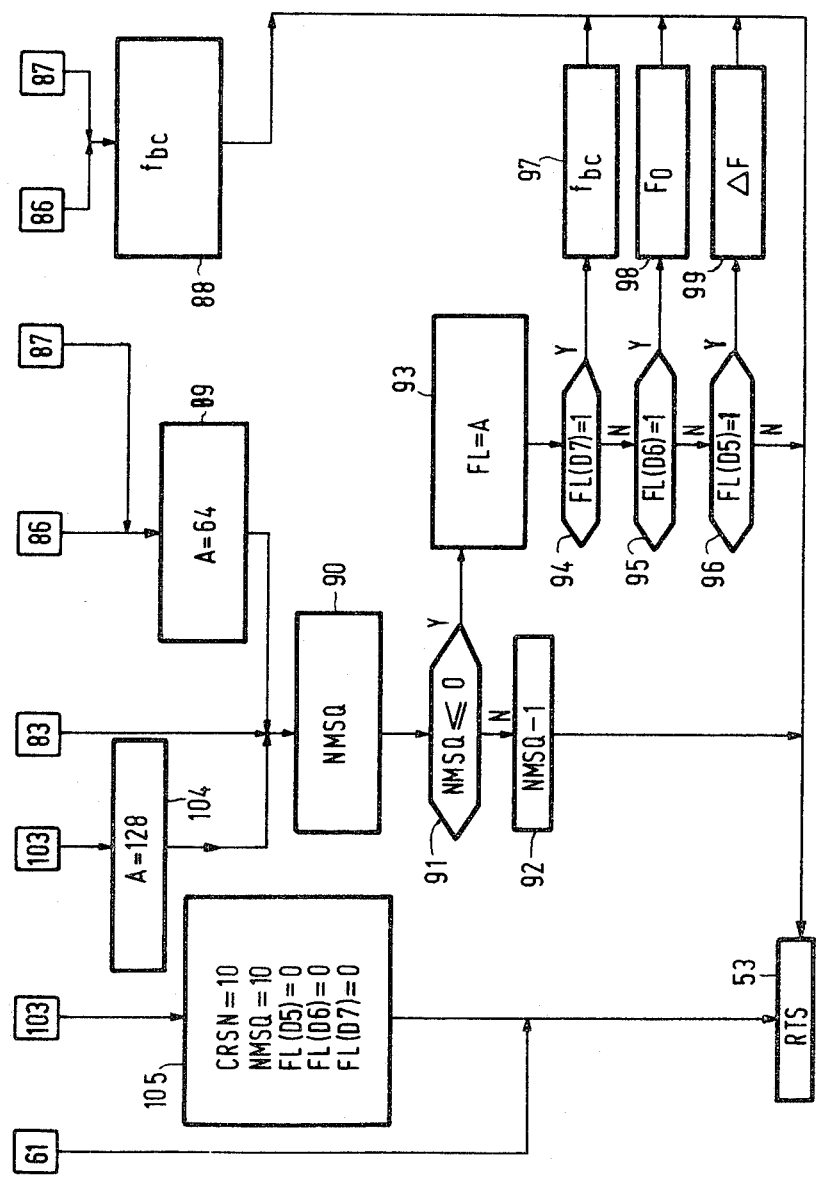

The processing necessary for implementing the invention will be described hereinafter with reference to the charts shown in the FIGS. 5a, 5b, 5c and the block diagram of FIG. 1.

The first counter in the block 21 has a cycle of 40 ms which is used as a time base for the calibration sequence. The maximum duration of the calibration phase is 40 ms. This phase occurs every 400 ms.

At the start of the calibration phase, the altimeter loop assumes the search mode. This state is triggered by the loss of control due to the disappearance of the ground signal; this is detected by the control discriminator 16. The ground signal is suppressed by the microprocessor 22 which sets the gain of the amplifier 14 to a minimum. The oscillator 24 is started, the control voltage of the generator 19 varies the frequency of the oscillator 24 from the high values to the low values and the calibration program is activated (START; FIG. 5a).

The microprocessor 22 reads a memory location MNS (block 50) which contains a value 10 at the start. A test (block 51) is performed in order to determine whether the value MNS is larger than or equal to 7. If so, the microprocessor performs the operation MNS−1 (block 52) and the program proceeds to a return instruction (block 53). This provides time for the stabilization of control loop. The entering of the calibration program is repeatedly triggered by the interruptions of the sawtooth signal.

When the value of MNS is smaller than 7 (block 51), the time base is changed from 200 kHz to 1 MHz and MNS is read again (block 55). Subsequently, the tests of the blocks 56 to 61 are performed on the value of MNS. If MNS=6 during the test of the block 56, the variable T is selected from the circuit 21, the microprocessor performs the operation MNS−1=5 (block 62) and the program enters the block 53. At the next passage, if MNS=5 during the test of the block 57, the value of T is measured, the variable T1 is selected, the operation MNS−1=4 is performed (block 63) and the program enters the block 53.

Similarly, if MNS=4 during the test of the block 58, the value of T1 is determined, the variable T2 is selected and the operation MNS−1=3 is performed (block 64). If MNS=3 in the test of the block 59, the value of T2 is determined, the variable T3 is selected, and the operation MNS−1=2 (block 65) is performed. If MNS=2 in the test of the block 60, the value of the variable T3 is determined and the operation MNS−1=1 is performed (block 66).

Subsequently, the microprocessor performs the calculations shown in the block 67:

$$TA = (T1+T2)2; \quad TA/2; \quad 3TA/2; \quad A1 = 3TA/2 - T.$$

The term 3TA/2 represents the necessary period of the calibration sawtooth in order to ensure that the frequency deviation ΔF emitted is 123 MHz; this condition is reached when A1=0. A1/8 is the correction which is applied to the amplitude of the sawtooth in order to obtain the correct frequency deviation ΔF.

The microprocessor performs the operation ΔF+A1/8 and loads the result at a memory address.

Subsequently, the value of ΔF is tested in the blocks 68 and 69 in order to determine whether it is within the specified limits, that is to say between 0 and 255. If the conditions ΔF>0 and ΔF<255 are satisfied, ΔF has a correct value and is applied to the circuit 26 (block 70) which adjusts the amplitude of the sawtooth.

If ΔF<0 in the test of the block 68, 0 is applied to the circuit 26 and ΔF is set to 0 (block 71). If ΔF>255 in the test of the block 69, the value 255 is applied to the circuit 26 and ΔF is set to 255.

Subsequently, the microprocessor performs the calculations which are shown in the block 73: TA/2; TA/4; A2=T3−TA/4; A2/8 and Fo+A2/8. If the conditions Fo>0 and fo<255 are satisfied, Fo has a correct value and is applied to the circuit 26 in order to shift the level of the modulation signal (block 76). If Fo<0 in the test of the block 74, Fo is set to 0 and 0 is applied to the circuit 26 (block 77). If Fo>255 in the test of the block 75, Fo is set to 255 and the value 255 is applied to the circuit 26 (block 78).

In order to test the effectiveness of the calibration of the frequency deviation ΔF and the mean frequency Fo, it suffices to verify that the terms A1 and A2 are approximately zero at the end of each calibration sequence. They are normally situated between +1 and −1. In these circumstances, the calibration stability is: ±0.5 MHz for the frequency deviation ΔF and ±1 MHz for the mean frequency Fo.

The memory location which contains the calculated value A1 is read (block 79). The condition A1>0 is tested (block 80); if not, the test of the block 81, A1+1>0 is performed. If the result of the test of the block 81 is larger than zero, the value of A1 is situated between the limits 0 and −1. If A1 is larger than 0 in the test of the block 80, the test of the block 82 is performed for the condition A1−1<0. If the result is smaller than zero, A1 is situated between the limits 0 and +1. If A1 is situated between +1 and −1, A2 is tested; if not, the operation MNS−1=0 is performed and the alarm code A is set to 32 (block 83).

If A1 is situated between +1 and −1, A2 is subsequently tested in the same manner. A2 is read (block 84) and the test A2>0 is performed (block 85). If A2≦0, the test of the block 86 verifies that A2+1>0, which means that A2 is situated between 0 and −1. If A2 is larger than 0 in the test of the block 85, the test of the block 87 verifies whether A2−1<0, which determines whether A2 is situated between 0 and +1. In the case where A2 is situated between +1 and −1, the program enters the block 88 (FIG. 5c).

If A2 is situated beyond the limits +1 and −1, the operation MNS−1=0 is performed and the alarm code A is set to 64 (block 89).

The alarm code A=32 or A=64 starts the reading of a memory location NMSQ in which the number of the successive calibration sequences is stored (block 90). NMSQ is set to the value 10 at the end of the last successful calibration phase. Thus, NMSQ≦0 is tested (block 91). If NMSQ>0, the operation NMSQ−1 is performed (block 92) and the program enters the block 53. Thus, if the first attempt to calibrate the frequency deviation ΔF and the mean frequency Fo is not successful, it is tried again, up to a maximum of 10 times. If the oscillator 10 is properly calibrated during a subsequent attempt, the program enters the block 88 to initiate the third counter in the circuit 21, which is used in the measurement of fbc. If not, NMSQ≦0 is found in the test of the block 91. In this case the failure code is loaded at an address FL and the radio altimeter is set to the alarm condition (block 93).

Subsequently, the type of failure is tested during the tests 94 to 96. The failure codes for the three types of failure are:

| | |
|---|---|
| fbc | failure code = 128 (10000000 in binary form), i.e. bit D7 activated in the 8-bit word (D7 to D0) FL; |
| Fo | failure code = 64 (01000000), i.e. bit D6 activated; |
| $\Delta_F$ | failure code = 32 (00100000), i.e. bit D5 activated. |

In this case, if D7=0 (block 94) and D6=1 (block 95), the mean frequency Fo is incorrect and a lamp on the display panel lights up (block 98). If D6=0, D5=1 is tested in the block 96 and if the test is positive, the frequency deviation ΔF is incorrect and another lamp on the display panel lights up (block 99).

If the source is correctly calibrated, the program branches from the start and the condition MNS=1 is tested (block 61), FIG. 5b. If MNS=1, eight periods of the calibration beat signal are measured by the third counter of the circuit 21. Each period has a duration of 40 μs. so 8 periods have a duration of 320 μs. The operation MNS−1=0 is performed and subsequently the value of 8/fbc is read by the microprocessor. The calibration beat frequency fbc has to be 25 kHz±2% in order to be correct so the inequalities 313<8/fbc<327 must be satisfied. If 8/fbc>327 in the test of the block 102, fbc is not correct and the alarm code A is set to 128. If 8/fbc>327, the test 8/fbc>313 is performed (block 103). If 8/fbc is larger than 313, the value of fbc is correct and the system is initiated again for the measuring phase and a given number of indicators and words are loaded with the reinitialization values which are:

NMSQ=10 for the next calibration phase FL(D5)=0, FL(D6)=0, FL(D7)=0 for indicating that there is no failure. CRSN=10. The next calibration routine is started after ten normal height measurements when CRSN=0.

At the end of this operation, the calibration routine is terminated and the measuring phase is initiated.

If 8/fbc is greater than 327 or smaller than 313 in the tests of the blocks 102 and 103 respectively, the alarm code A is set to 128 (block 104) and the program follows the sequence of the blocks 90, 91 and 92, i.e. it is attempted ten times to measure fbc within the specified limits. If this is found to be impossible after the tenth attempt, the sequences of the blocks 93 and 94 are performed and a lamp on the display panel lights up (block 97).

We claim:

1. An apparatus for measuring the distance to an object, comprising:
   (a) a carrier wave source for producing a frequency-modulated carrier wave having a periodic frequency deviation $\Delta F$ and a mean frequency $F_o$;
   (b) means coupled to the carrier wave source for detecting the occurrence of predetermined first and second frequencies when they are produced by the source;
   (c) means coupled to the carrier wave source for emitting the carrier wave toward the object;
   (d) means for receiving a portion of the carrier wave reflected by the object;
   (e) means coupled to the receiving means and the carrier wave source for mixing received carrier wave energy with emitted carrier wave energy and forming a beat signal having a beat frequency $f_b$;
   (f) a calibration signal source for producing a calibration beat signal having a frequency $f_{bc}$; and
   (g) control means coupled to the carrier wave source, the detecting means, the mixing means and the calibration signal source,
   said control means periodically interrupting operation of the measuring apparatus to effect calibration of the apparatus,
   during operation said control means maintaining the beat frequency constant by effecting variation of the period of the frequency modulation, said variation representing the distance to the object,
   and during calibration said control means calibrating the frequency deviation with respect to the predetermined first and second frequencies.

2. An apparatus as in claim 1 wherein said detecting means includes resonant cavities tuned to the first and second frequencies and means coupled to the cavities for producing first and second pulses when the respective first and second frequencies occur.

3. An apparatus as in claim 2 wherein said control means includes the following elements for calibrating the frequency deviation:
   (a) means for determining the time $T_A$ between said first and second pulses;
   (b) means for performing the calculation $K \cdot T_A$, where $K = T/T_A$ and where T is the period of modulation required to obtain the frequency deviation $\Delta F$;
   (c) means for comparing $K \cdot T_A$ with T; and
   (d) means for adjusting the frequency deviation to decrease any inequality between $K \cdot T_A$ and T.

4. An apparatus as in claim 3 wherein said control means includes the following elements for effecting centering of the frequency range between the predetermined first and second frequencies within the period of modulation;
   (a) means for determining the time $T_3$ between the beginning of the modulation period and the occurrence of the first pulse;
   (b) means for comparing $T_3$ and $(T - T_A)/2$; and
   (c) means for adjusting $F_o$ to decrease any inequality between $T_3$ and $(T - T_A)/2$.

* * * * *